(12) United States Patent
Furuse et al.

(10) Patent No.: US 7,632,536 B2
(45) Date of Patent: Dec. 15, 2009

(54) METHOD FOR PRODUCING ELECTROCONDUCTIVE PATTERN, AND METHOD FOR PRODUCING ELECTRONIC DEVICE, ELECTRON EMITTING DEVICE AND IMAGE FORMING APPARATUS

(75) Inventors: Tsuyoshi Furuse, Isehara (JP); Shosei Mori, Hiratsuka (JP); Masahiro Terada, Hadano (JP); Tsuyoshi Ibe, Fujisawa (JP); Makoto Kojima, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 909 days.

(21) Appl. No.: 11/214,830

(22) Filed: Aug. 31, 2005

(65) Prior Publication Data

US 2006/0045960 A1 Mar. 2, 2006

(30) Foreign Application Priority Data

Sep. 1, 2004 (JP) ............................. 2004-253705

(51) Int. Cl.
*B05D 5/12* (2006.01)

(52) U.S. Cl. ..................................... 427/77; 427/385.5

(58) Field of Classification Search .................. 427/77, 427/78, 385.5
See application file for complete search history.

(56) References Cited

U.S. PATENT DOCUMENTS

| 4,959,132 | A | * | 9/1990 | Fedkiw, Jr. .................. 205/344 |
| 6,737,287 | B1 | | 5/2004 | Furuse et al. .................. 438/21 |
| 6,833,224 | B2 | | 12/2004 | Furuse et al. .................. 430/16 |
| 7,115,432 | B2 | | 10/2006 | Kagami et al. ................. 438/30 |
| 2003/0026959 | A1 | | 2/2003 | Furuse et al. ............. 428/195.1 |
| 2006/0045961 | A1 | | 3/2006 | Furuse et al. .................. 427/77 |
| 2006/0046208 | A1 | | 3/2006 | Mori et al. .................. 430/330 |

FOREIGN PATENT DOCUMENTS

JP 2003-31922 1/2003

OTHER PUBLICATIONS

The People's of Republic of China Notification of the First Office Action dated Mar. 13, 2009, 10 pages (Translation included).

* cited by examiner

*Primary Examiner*—Timothy H Meeks
*Assistant Examiner*—Jimmy Lin
(74) *Attorney, Agent, or Firm*—Fitzpatrick, Cella, Harper & Scinto

(57) ABSTRACT

A method for producing a pattern of an electroconductive member, comprises: a step of forming on a substrate surface a resin film containing acid group; a step of incorporating into the resin film a liquid containing a metal complex salt and having a pH value of 5 to 7; and a step of baking the resin film to form the electroconductive member from a metal component incorporated into the resin film, thereby improving uniformity and speed of an adsorbing of the metal component into the resin, and providing uniform characteristics of the electroconductive pattern.

14 Claims, 3 Drawing Sheets

METHOD FOR PRODUCING ELECTROCONDUCTIVE PATTERN, AND METHOD FOR PRODUCING ELECTRONIC DEVICE, ELECTRON EMITTING DEVICE AND IMAGE FORMING APPARATUS

BACKGROUND OF THE INVENTION

1. Field of the Invention

The present invention relates to a method for producing a fine electroconductive member pattern such as a wiring provided in various electronic devices, and also to a producing method for an electronic device, an electron emitting device and an image display apparatus utilizing such producing method.

2. Related Background Art

For forming a pattern of an electroconductive film such as an electrode or a wiring on a substrate, there are known (1) a method of coating a paste, containing an electroconductive material by a screen printing method on a substrate and drying and baking the coated film, (2) a transfer method (offset printing method), (3) a method of coating a solution containing a metal component, drying and baking the coated solution to form a metal film, covering a predetermined area with a mask such as a photoresist, and removing an area not covered by the mask by an etching, (4) a method of providing a metal-containing paste with a photosensitive material, exposing a desired portion to a light and executing a development to form a pattern, and (5) a method of mixing a photosensitive resin with an oil-soluble metalorganic compound thereby forming an electrode pattern.

However, the aforementioned method (1) is difficult to apply for the formation of a fine electrode pattern, and the method (2) is insufficient in uniformity and reproducibility of the film thickness. Also the method (3), particularly in case of forming an electrode pattern with a precious metal such as platinum, requires a strong acid for etching and is difficult to apply to a fine pattern formation because of an erosion of the resist material or an erosion of an insulating substrate. Also the method (4), utilizing an organic solvent, requires an explosion-proof facility for coating, drying and baking steps and necessitates a careful handling of the chemical, and also has a drawback of a significant environmental burden as a chlorinated solvent is employed in the development. The method (5) results in a high cost, because the water-soluble metal compound in an unexposed area is discarded in the developing step.

On the other hand, the present applicant has proposed, for producing a fine electrode pattern efficiently and with a low cost, a method of causing a photosensitive resin pattern to adsorb a solution containing a metalorganic compound thereby forming an electrode pattern (Japanese Patent Application Laid-open No. 2003-31922).

However, the aforementioned method described in Japanese Patent Application Laid-open No. 2003-31922, in case of employing a solution containing a water-soluble metalorganic compound, results in a decrease in the concentration of the metalorganic compound and a decrease in pH value in time, whereby a time and an amount of adsorption of the metalorganic compound in the resin pattern may fluctuate.

SUMMARY OF THE INVENTION

An object of the present invention is, in a method of producing a pattern of an electroconductive member by impregnating a resin film with a liquid containing a metal compound, to achieve a shortened process and a uniformity in the obtained pattern.

Another object of the present invention is to provide a producing method for an electronic device provided with a wiring of a fine and highly precise pattern, such as a thin film transistor or an electron emitting device, and an image display apparatus, utilizing the aforementioned method.

The present invention provides a producing method for a pattern of an electroconductive member, including a step of forming on a substrate surface a resin film containing acid group; a step of incorporating into the resin film a liquid containing a metal complex salt and having a pH value of 5 to 7; and a step of baking the resin film to form the electroconductive member from a metal component incorporated into the resin film.

The present invention also provides a producing method for a pattern of an electroconductive member, including a step of forming a resin film on a substrate surface, a step of incorporating into a resin film of a resin having an acidic group, a liquid containing a first metal complex salt, and a second metal complex salt of which a conjugate acid is a weaker acid than a conjugate acid of the first metal complex salt and of which a metal complex component is same as that of the first metal complex salt, and a step of baking the resin film impregnated with the metal component to form a conductive film on the substrate.

The present invention further provides a producing method for a pattern of an electroconductive member including a step of forming a resin film on a substrate surface, a step of incorporating, into a resin film of a resin having an acidic group, a liquid containing a first metal complex salt, and a step of baking the resin film incorporating the metal component to form an electroconductive film on the substrate, the method being characterized, in the step of impregnating the resin film with the metal component of the first metal complex salt, in adding, to the liquid containing the first metal complex, a liquid containing a second metal complex salt of which a conjugate acid is a weaker acid than a conjugate acid of the first metal complex salt and of which a metal complex component is same as that of the first metal complex salt.

DETAILED DESCRIPTION OF THE PREFERRED EMBODIMENTS

Figure 1A:
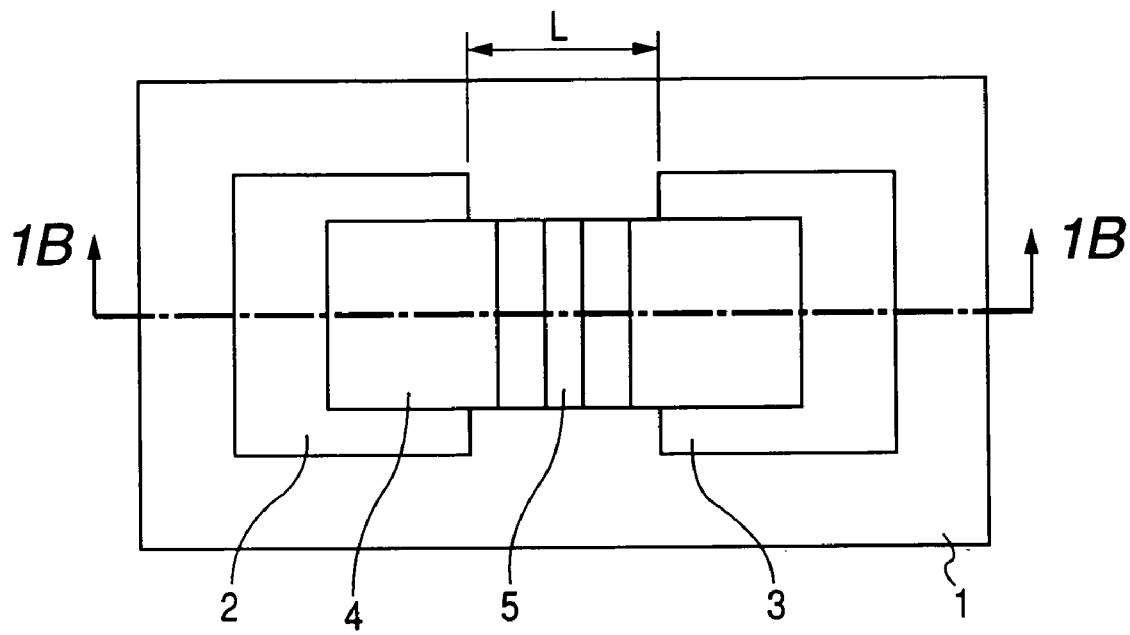
FIGS. 1A and 1B are schematic views of an electron emitting device, constituting an electron source, produced by a producing method of the present invention.

In a first aspect, the present invention provides a method for producing a pattern of an electroconductive member, characterized in including a step of forming a resin film on a substrate surface, a step of incorporating into the resin film of a resin having an acidic group, a liquid containing a metal complex salt and having a pH value of 5 to 7 thereby impregnating the resin film with a metal component of the metal complex salt, and a step of baking the resin film incorporating the metal component to form a conductive film on the substrate.

In a second aspect, the present invention provides a method for producing a pattern of an electroconductive member, characterized in including a step of forming a resin film on a substrate surface, a step of incorporating into a resin film of a resin having an acidic group, a liquid containing a first metal complex salt and a second metal complex salt of which a conjugate acid is a weaker acid than a conjugate acid of the first metal complex salt and of which a metal complex component is same as that of the first metal complex salt, to incporporate into the resin film the metal component of the first or second metal complex salt, and a step of baking the resin film incorporating the metal component to form a conductive film on the substrate.

In a third aspect, the present invention provides a method for producing a pattern of an electroconductive member, including a step of forming a resin film on a substrate surface, a step of incorporating into the resin film of a resin having an acidic group, a liquid containing a first metal complex salt to incorporate into the resin film the metal component of the first metal complex salt, and a step of baking the resin film impregnated with the metal component to form a conductive film on the substrate, the method being characterized, in the step of impregnating the resin film with the metal component of the first metal complex salt, in adding, to the liquid containing the first metal complex salt, a liquid containing a second metal complex salt of which a conjugate acid is a weaker acid than a conjugate acid of the first metal complex salt and of which a metal complex component is same as that of the first metal complex salt.

In a fourth aspect, the present invention provides a method for producing an electronic device having a substrate provided with a circuit including an electroconductive member in at least a part thereof, the method being characterized in that at least a part of the electroconductive member is formed by a method for producing a pattern of a conductive member according to either one of claims 1 to 6.

In a fifth aspect, the present invention provides a method for producing an electron emitting device including an electroconductive member as a constituent member, the method being characterized in that the electroconductive member is formed by a method for producing a pattern of a conductive member according to either one of claims 1 to 6.

In a sixth aspect, the present invention provides a method for producing an image display apparatus provided with an electron source including, on a substrate, plural electron emitting devices and plural row wirings and plural column wirings for constituting a matrix wiring of the electron emitting devices, and an image forming member including a light emitting member which emits light by an irradiation of the electrons emitted from the electron emitting devices, the method being characterized in that at least either of electrodes constituting the electron emitting devices, the row wirings and the column wirings is formed by the aforementioned method for producing the pattern of the conductive member.

According to the present invention, in the step of impregnating the resin film with the metal component of the metal complex salt, since the liquid containing the metal complex salt is in an optimum pH range, the metal component has a high absorption rate into the resin film and is uniformly absorbed.

Also according to the present invention, in the step of impregnating the resin film with the metal component of the metal complex salt, since the liquid containing the metal complex salt is controlled at a constant pH and a constant metal concentration, the metal component is absorbed promptly and uniformly in the resin film without a loss in the absorption rate.

It is therefore possible, according to the present invention, to form a uniform pattern of a conductive member within a shorter time, and, by the application of the producing method, to efficiently form electrodes and wirings of a high definition thereby providing an electronic device, such as a thin film transistor, an electron emitting device or an image display apparatus of a high reliability in inexpensive manner.

In the following, preferred embodiments of the present invention will be explained in detail. However, a dimension, a material, a shape, a relative positioning and the like of constituents described in the embodiments should not be construed to restrict the scope of the invention to such descriptions.

(1) Resin

A resin to be employed in the present invention is capable of reacting with a metal component of a liquid containing a metal complex salt to be explained later and absorbing the metal component by ion exchange in the resin film, and is preferably provided with an acidic group. More specifically, it is a resin having —COOH or —SO$_3$H. There is more preferred a photosensitive resin capable of easy patterning, which may be a water-soluble photosensitive resin or a solvent-soluble photosensitive resin. The water-soluble photosensitive resin means a photosensitive resin for which a development in a developing step to be explained later can be executed with water or a developer containing water by 50 mass % or more, and the solvent-soluble photosensitive resin means a photosensitive resin for which a development in the developing step can be executed with an organic solvent or a developer containing an organic solvent by 50 mass % or more.

The photosensitive resin may be of a type having a photosensitive group in a resin structure, or a type in which a sensitizer is mixed with a resin. In the photosensitive resin composition of either type, a photoreaction initiator or a photoreaction inhibitor may be mixed suitably. Also it may be a type in which a coated film of a photosensitive resin, soluble in a developer, is rendered insoluble in the developer by a photoirradiation (negative type) or a type in which a coated film of a photosensitive resin, insoluble in a developer, is rendered soluble in the developer by a photoirradiation (positive type).

In the present invention, ordinary photosensitive resins of a wide range can be employed, and, a resin having a carboxylic acid group is preferable as the resin capable of ion exchange. Also a water-soluble photosensitive resin is preferable in consideration of ease of maintaining a satisfactory work environment and a smaller burden of the waste material on the environment.

Further for such water-soluble photosensitive resin, there can be employed a developer solution containing water by 30 mass % or more and containing a lower alcohol such as methyl alcohol or ethyl alcohol, for increasing the drying speed, within a range less than 50 mass %, or a developer solution containing a component for promoting dissolution or improving stability of the photosensitive resin component. However, from the standpoint of alleviating an environmental burden, there is preferred a resin developable with a developer solution of a water content of 50 mass % or higher, more preferably a resin developable with a developer solution of a water content of 70 mass % or higher, and most preferably a resin developable with water only as the developer. Such water-soluble photosensitive resin can be, for example, formed by a water-soluble resin such as an acrylic acid resin or a methacrylic acid resin.

(2) Liquid Containing Metal Complex Salt

The liquid containing a metal complex salt to be employed in the present invention is such that a metal component of the metal complex salt is absorbed in the resin film by an ion exchange and forms an electroconductive film of a metal or a metal compound, by baking. The metal component can be Pt, Ag, Pd, Cu, Ni, Co, Ir or Ru, and a nitrogen-containing compound is preferred as a ligand.

Also the liquid containing the metal complex can be a liquid containing water by 50 mass. % or more and containing a lower alcohol such as methyl alcohol or ethyl alcohol, for increasing the drying speed, within a range less than 50 mass %, or a liquid containing a component for promoting dissolution or improving stability of the metal complex salt. However, from the standpoint of alleviating an environmental burden, there is preferred a liquid of a water content of 50 mass % or higher, more preferably a liquid of a water content of 70 mass % or higher, and most preferably water only.

Also for improving a film quality and an adhesion to the substrate in the obtained member of a metal or a metal compound patterned in a desired shape, an element such as rhodium, bismuth, vanadium, chromium, tin, lead or silicon or a compound thereof is preferably contained in the liquid containing the metal complex salt.

(2) Liquid Containing Second Metal Complex Salt

In the present invention, the liquid containing the aforementioned metal complex salt (hereinafter called liquid containing first metal complex salt) is preferably regulated at a pH value within a range of 5 to 7. A pH value less than 5 undesirably prolongs a time required by the resin film for absorbing the metal component. A time required for absorbing the metal component is preferably 3 minutes or less. Also a pH value exceeding 7 is undesirable, as the resin film, particularly of a resin having a carboxylic acid group, may be peeled off by swelling from the substrate, thus causing a defect.

The pH value can be controlled for example by adding acetic acid or the like.

A pH value of the liquid containing the metal complex salt assumes various values by the basicity of the counter ion of the metal component, but, because the proton in the resin film and the metal component are exchanged to cause dissolution of protons, the pH value becomes lower and the concentration of the metal component is also lowered by the repetition of the absorbing process, whereby the time required for absorbing the metal component and the absorption of the metal component may become uneven.

For controlling the pH value, lowered in the process, of the liquid containing the metal complex salt, there can be utilized an addition of a basic solution or a basic gas, or a contact with an ion exchange resin, but, controlling the pH of the liquid containing the metal complex salt and the change in the concentration of the metal component, there is more preferred a method of adding a liquid containing a second metal complex salt, capable of controlling the metal concentration and the pH at the same time. For the purpose of distinguishing from the second metal complex salt, the metal complex salt explained in (2) will be represented as a first metal complex salt.

The second metal complex salt, employed in the present invention has a conjugate acid weaker than a conjugate acid of the first metal complex salt, and has a metal complex component same as that of the first metal complex salt. A conjugate acid of a metal complex salt means HX in case the metal complex salt is represented by MX (M: cation, X: anion). In a system containing a dissolved metal complex salt MX, an addition of a metal complex salt MY having a same metal complex part but having a weaker conjugate acid of the salt causes a shift of a following equilibrium toward the right-hand side because HX is a stronger acid than HY, thereby liberating HY:

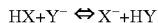

A case where HY is carbonic acid is particularly preferable, as it is finally decomposed to carbon dioxide and water and does not remain in the system under the aforementioned condition. Thus, the second metal complex salt in the present invention is preferably a carbonate or a hydrogencarbonate.

Also HX is not particularly restricted as long as it is a stronger acid than HY, but acetic acid is particularly preferably employed in consideration of pH controllability in the system and of environmental burden. Thus the first metal complex salt is preferably an acetate. More specifically, it is preferable to employ an acetate as the first metal complex salt, to regulate the pH value of the liquid containing the first metal complex salt to 5 to 7 with acetic acid, and to control the pH and the metal concentration in the liquid containing the first metal complex salt, fluctuating by the repetition of the absorbing step, by adding a liquid containing a carbonate, as the liquid containing the second metal complex salt.

(4) Producing Method for Pattern of Electroconductive Member

Process of the producing method for the pattern of the conductive member of the invention will be explained by an example of utilizing a photosensitive resin as the resin. More specifically, the process can be executed through a resin film forming step (coating step, drying step, exposure step and developing step), an absorption step of impregnating the resin film with the metal component, a rinsing step executed if necessary, and a baking step.

A coating step is a step of coating the aforementioned photosensitive resin on a substrate on which a pattern of a conductive member is to be formed. The coating can be executed by various printing methods (such as screen printing, offset printing, or flexo printing), a spinner method, a dipping method, a spraying method, a stamping method, a roller method, a slit coater method or an ink jet method.

A drying step is a step of evaporating a solvent in the photosensitive resin film coated on the substrate in the coating step, thereby drying the coated film. The drying of the coated film may be executed at the room temperature, but is preferably executed under heating, in order to reduce a drying time. Drying under heating can be executed, for example, with an oven without air blowing, a dryer, or a hot plate. Though dependent on a formulation and a coating amount of the composition for forming electrode/wiring to be coated, the drying can be generally achieved by placing for 1 to 30 minutes at a temperature of 50 to 100° C.

An exposure step is a step of exposing the photosensitive resin film dried in the drying step, to a predetermined pattern, namely a pattern of a film to be produced (such as a predetermined shape of electrode or wiring). An area to be exposed by a light irradiation in the exposure step is different, depending on whether the photosensitive resin to be employed is a negative type or a positive type. In case of a negative type which becomes insoluble in the developer solution by the light irradiation, the exposure is executed by irradiating an area to be left of the resin film with a light, but, in case of a positive type which becomes soluble in the developer solution by the light irradiation, the exposure is executed by irradiating an area other than the area to be left of the resin film with a light. A selection of the light irradiated area and the light non-irradiated area can be achieved as in a mask formation in the ordinary photoresist.

A developing step is a step of eliminating, in the photosensitive resin film exposed in the exposure step, an area other than the area to be left of the resin film. In case of a negative photosensitive resin, a photosensitive resin film not subjected to a light irradiation is soluble in the developer solution while a photosensitive resin film subjected to a light irradiation is insoluble in the developer solution, so that the development can be executed by dissolving and removing, with the developer solution, the photosensitive resin film of a light non-irradiated area, not insolubilized in the developer solution. Also in case of a positive photosensitive resin, a photosensitive resin film not subjected to a light irradiation is insoluble in the developer solution while a photosensitive resin film subjected to a light irradiation is solubilized in the developer solution, so that the development can be executed by dissolving and removing, with the developer solution, the photosensitive resin film of a light irradiated area, solubilized in the developer solution.

In case of employing a water-soluble photosensitive resin, the developer solution can be water or similar to a developer solution employed for ordinary photoresists. Also in case of a photosensitive resin soluble in an organic solvent, the developer solution can be an organic solvent or similar to a developer solution employed for photoresists of solvent type. In the foregoing, there has been explained a case of utilizing a photosensitive resin for forming a resin pattern, but, in case of employing a non-photosensitive resin, the resin pattern may be formed by a printing, a transfer method or a lift-off method.

An absorption step for impregnating the resin film with a metal component is a step of providing the resin film formed in the foregoing steps with a liquid containing the aforementioned first metal complex salt thereby causing the resin film to absorb a metal component by an ion exchange. More specifically, it can be achieved by a dipping method of immersing the substrate bearing the resin film in a liquid containing the aforementioned first metal complex salt, or a coating method of coating the resin film with a liquid containing the first metal complex salt by a spray or a spin coating. Prior to the contact of the resin film with the liquid containing the first metal complex salt, the resin film may be swelled with an aqueous solvent of such liquid.

In the absorbing step, there is employed, as explained before, a liquid containing the first metal complex salt and having a pH of 5 to 7, and the pH and metal concentration changing in time are controlled by adding a liquid containing the second metal complex salt.

In the absorbing step of impregnating the resin film with the metal component, the concentration and the pH of the liquid containing the first metal complex salt are influenced also by a carry-over of the aforementioned aqueous solvent sticking to the substrate, it is desirable to minimize, as far as possible, the carry-over amount of the aqueous solvent. For this purpose, there can be utilized a method of a water-repellent treatment on an end face of the substrate, or a method of evaporating the aqueous solvent by heating. Also in case the liquid containing the first metal complex salt is concentrated for example by evaporation, it is possible to maintain the concentration and the pH of the liquid containing the first metal complex salt at a constant level by controlling the amount of the aqueous solvent sticking to the substrate. Furthermore, in order to maintain the concentration and the pH of the liquid containing the metal complex salt at a constant level, the tank of the solution containing the metal component may be provided in plural units (two or more) and may be utilized under suitable switching.

Also in case of taking out the substrate after the absorption step of impregnating the resin with the metal component, the concentration and the pH of the liquid containing the first metal complex salt are influenced by a carry-out amount of the liquid containing the first metal complex salt, sticking to the substrate. Therefore, the carry-out amount of the liquid containing the first metal complex salt is preferably made as small as possible. For this purpose, there can be utilized, for example, a method of a water-repellent treatment on an end face of the substrate.

A rinsing step is a step, after impregnating the resin film with the metal component, of rinsing and eliminating an excessive liquid containing the metal complex salt, adhering to the resin film or an excessive liquid adhering to a portion other than the resin film. The rinsing step can be executed by employing a rinsing liquid similar to the solvent in the liquid containing the metal complex salt, and by a method of immersing the substrate bearing the resin film in such rinsing liquid or by a method of spraying the rinsing liquid to the substrate bearing the resin film.

The rinsing step may also be executed by an air blowing or a shaking, as long as the excessive solution can be sufficiently shaken off. Also in the rinsing step, the liquid containing the metal complex salt may be removed in a certain amount, but such amount is extremely small, and the environmental burden can be significantly alleviated by recovering and reusing such liquid.

A baking step is a step of baking the resin film, subjected to the developing step and the absorption step and the rinsing step if necessary (namely the photosensitive resin film in the light irradiated area in the negative type or the photosensitive resin film in the light non-irradiated area in the positive type), thereby forming a pattern of an electroconductive member constituted of a metal or a metal compound.

The baking can be executed in the air, in case the metal component is a precious metal, but is preferably executed in an oxygen-free atmosphere (for example in an inert gas atmosphere such as nitrogen) in case of forming an metal film, not a metal oxide film, of an easily oxidizable metal such as copper or palladium.

The baking, though dependent on the type of the organic component contained in the resin film, is generally executed for a period of several to several tens of minutes at a temperature of 300 to 600° C. The baking can be executed for example in a hot-air circulating oven. The baking allows to obtain, on the substrate, a pattern of a conductive member as a metal or metal oxide film according to a predetermined pattern.

In the following, there will be explained a method of producing an image display apparatus, in which the producing method for the pattern of electroconductive member of the invention can be applied advantageously.

An image display apparatus of the present invention is provided with an electron source including, on a substrate, plural electron emitting devices and plural row wirings and plural column wirings for constituting a matrix wiring of the electron emitting devices, and an image forming member including a light emitting member which emits light by an irradiation of the electrons emitted from the electron emitting devices, and at least either one of electrodes constituting the electron emitting devices, the row wirings and the column wirings is formed by the aforementioned method for producing the pattern of the conductive member of the invention.

Figure 1B:
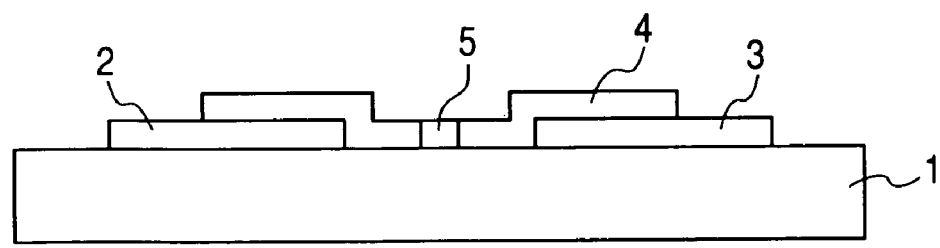

FIGS. 1A and 1B schematically show a configuration of a surface conduction electron emitting device as an example of an electron emitting device constituting such electron source. FIG. 1B is a cross-sectional view along a line 1B-1B in FIG. 1A. In these drawings, there are shown a substrate 1, device electrodes 2, 3, an electroconductive film 4 and an electron emitting part 5.

The device shown in FIGS. 1A and 1B is constructed by forming an electroconductive film 4 in connection with a pair of device electrodes 2, 3 formed on the substrate 1, and then applying an energization process called a forming to the electroconductive film 4 to locally destruct, deform or denature the electroconductive film 4 thereby forming a portion of a high electrical resistance including a fissure, and the device shows a phenomenon of an electron emission from the portion of electrical high resistance including the fissure (electron emitting part 5) when a current is supplied along the electroconductive film 4.

Other examples include an electron emitting device of a field emission (FE) type, and an electron emitting device having a metal/insulator/metal (MIM) configuration.

Figure 2:
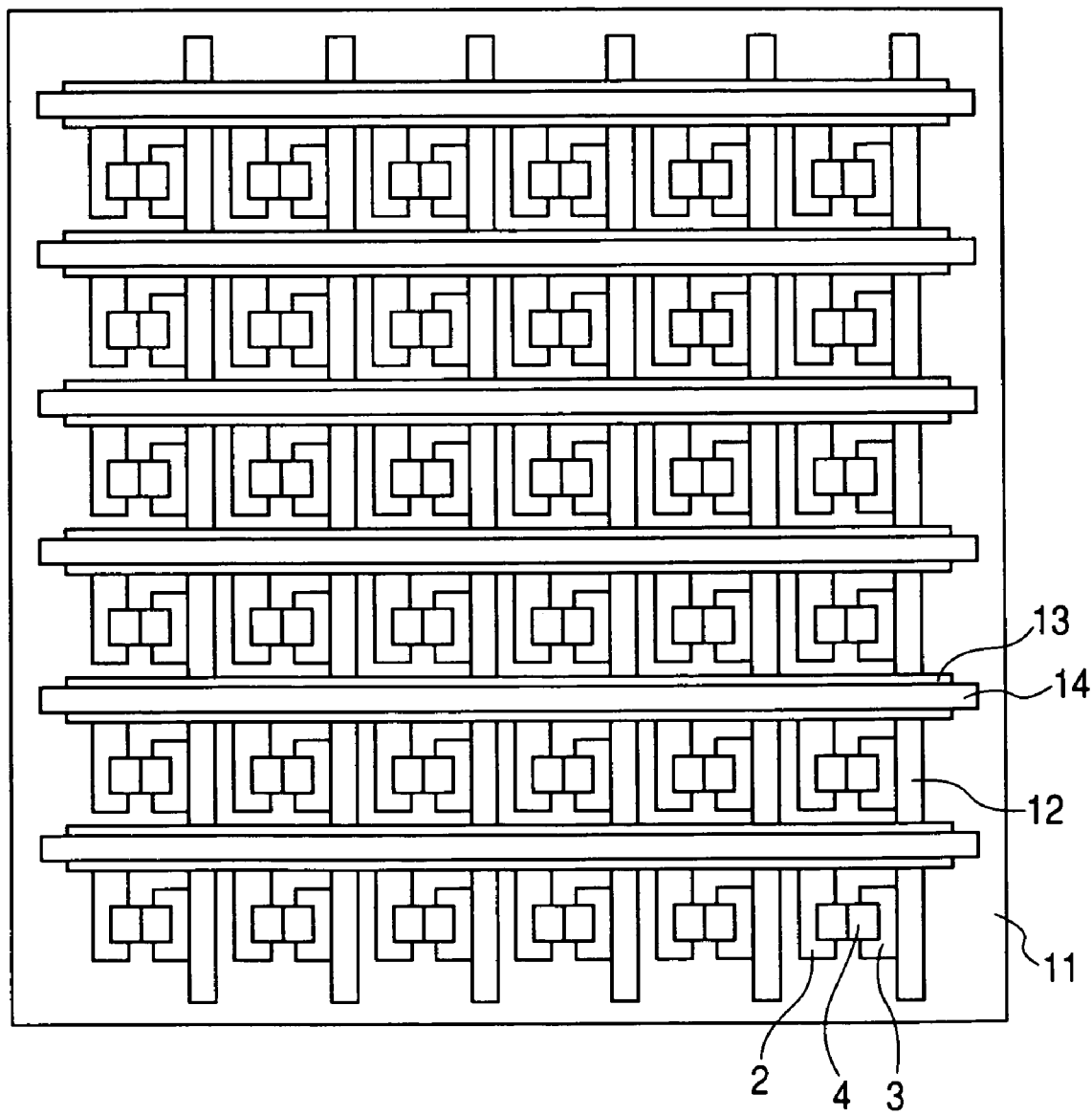
FIG. 2 is a schematic view of an electron source produced by the producing method of the present invention.

FIG. 2 schematically shows a configuration of an electron source utilizing the electron emitting devices shown in FIGS. 1A and 1B, wherein shown are a substrate 11, a lower wiring 12, an interlayer insulation layer 13 and an upper wiring 14. The electron source of the present embodiment is formed by connecting plural electron emitting devices in a matrix wiring, and each electron emitting device has a configuration similar to that shown in FIGS. 1A and 1B. The electron source shown in FIG. 2 is constructed by arranging an electron emitting device, having a pair of device electrodes 2, 3 in plural units in a matrix arrangement along X and Y directions, connecting a device electrode 2 of each of the plural electron emitting device, arranged in a same row, commonly to an upper wiring 14 in the X-direction, and also connecting the other device electrode 3 of each of the plural electron emitting device, arranged in a same column, commonly to an lower wiring 12 in the Y-direction. This constitutes so-called simple matrix arrangement.

In the producing method for the image display apparatus of the invention, the lower wiring 12 can be formed simultaneously at the formation of the device electrode 3.

In an electron emitting device as shown in FIGS. 1A and 1B, it is also possible, by changing a film thickness of a same electroconductive material in the producing method of the pattern of the electroconductive member of the invention, to form device electrodes 2, 3, the electroconductive film 4 and a charge-up suppressing resistance control portion (not shown), within a pixel. In such case, a resistance Rs is controlled at several tens of ohms in the device electrode, at several kiloohms in the electroconductive film 4 between the device electrodes 2, 3, and at 1 giga to teraohms in the charge-up suppressing resistance control portion.

An image display apparatus of the invention can be constructed by combining the aforementioned electron source with an image forming member, including a light emitting member which emits light by an irradiation with electrons emitted from the electron emitting devices of the electron source. A display panel usable as a television or a computer display can be obtained by utilizing, as the image forming member, a member having a phosphor which emits a visible light by the electrons. Also there can be obtained a copying machine or a printer by employing a photosensitive drum as the image forming member and by developing a latent image, formed on the photosensitive drum by the irradiation with the electron beam, with a toner.

Figure 3:
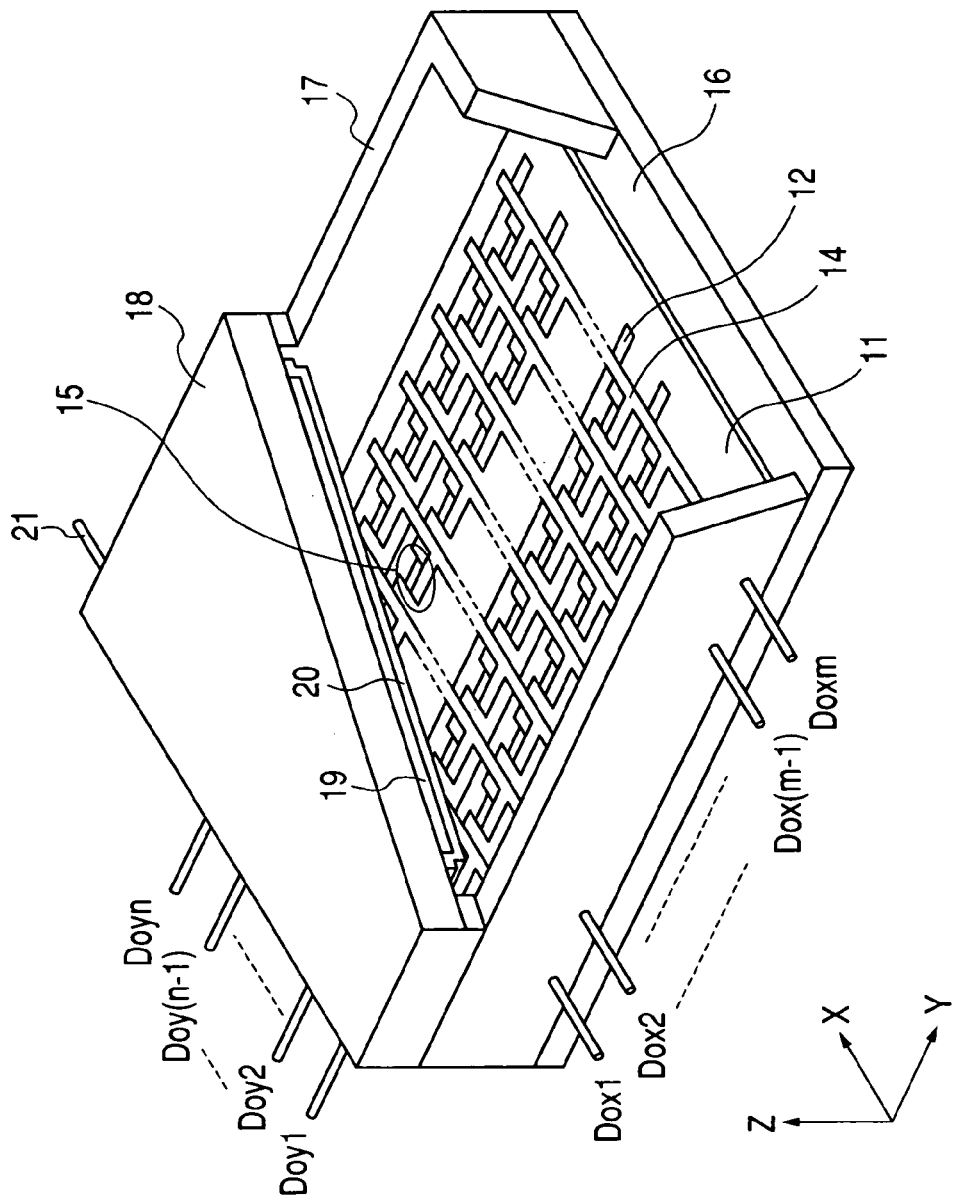
FIG. 3 is a schematic view of an image display apparatus produced by the producing method of the present invention.

In the following, there will be explained, with reference to FIG. 3, an image display apparatus utilizing the electron source of the simple matrix arrangement shown in FIG. 2. FIG. 3 is a partially cut-off schematic view of a display panel of an image display apparatus of the invention.

Referring to FIG. 3, there are shown an electron emitting device 15 shown in FIGS. 1A and 1B, a rear plate 16, a face plate 18 constituted of a glass substrate and bearing a phosphor film 19 and a metal back 20 on an internal surface thereof, a supporting frame 17 and a high-voltage source 21. An envelope is formed by sealing the rear plate 16, the supporting frame 17 and the face plate 18 for example in a vacuum of about $10^{-5}$ Pa. In case the electron source substrate 11 has a sufficient strength, the electron source substrate 11 and the support frame 17 may be adhered directly, without utilizing the rear plate 16.

An envelope having a sufficient strength to the atmospheric pressure even in a large-area panel can be constructed by providing an unillustrated support member, called a spacer, between the face plate 18 and the electron source substrate 11.

Also in order to maintain the vacuum in the envelope after the sealing, it is preferred to execute a getter process before or after the sealing.

The phosphor film 19 is constituted of a phosphor substance only in case of a monochromatic display, but, in case of a color display, is constituted of phosphors and a black electroconductive member called a black stripe or a black matrix, depending on the arrangement of the phosphors. The black stripe or the black matrix is provided for the purposes of obtaining a black boundary portion between the phosphors of three primary colors required for a color display, thereby suppressing a color mixing phenomenon, and of suppressing a contrast loss caused by a reflection of the external light by the phosphor film.

On the internal surface of the phosphor film 19, a metal back 20 is usually provided. Such metal back 20 is provided for mirror reflecting a light, directed inwardly among the light emitted by the phosphor, toward the face plate 18 thereby improving the luminance, and for serving as an anode electrode for applying an electron beam accelerating voltage. The metal back can be prepared, after the preparation of the phosphor film, executing a smoothing process (called filming) of the internal surface of the phosphor film and then depositing aluminum for example by vacuum evaporation.

In the aforementioned sealing operation, since the phosphor of each color and each electron emitting device have to be aligned in case of a color display, the upper and lower substrates have to be sufficiently aligned for example by an impingement method.

A getter process may be executed as a vacuum of about $10^{-5}$ Pa is required at the sealing and also in order to maintain the vacuum level at the sealing. This process is to heat a getter provided in a predetermined position (not shown) in the envelope, for example by a resistance heating or a high-frequency induction heating, immediately before or after the sealing of the envelope, thereby forming an evaporated film. The getter is usually principally constituted of Ba, and maintains the vacuum by an adsorbing function of such evaporated film.

EXAMPLES

Examples 1-3, Comparative Examples 1-4

A photosensitive resin (methacrylic acid-methyl methacrylate-ethyl acrylate-n-butyl acrylate-azobisisobutyronitrile copolymer) was coated on an entire surface of a glass substrate (75 mm×75 mm×thickness 2.8 mm) with a roll coater and was dried for 2 minutes at 45° C. on a hot plate. Then, utilizing a negative photomask, an exposure in a contact state of the substrate and the mask was made with an ultra high-pressure mercury lamp (illumination intensity=8.9 mW/cm$^2$), for an exposure time of 2 seconds. Then a development was conducted by a dipping method for 30 seconds, utilizing purified water as a developer liquid, thereby obtaining a desired resin pattern. The resin pattern had a thickness of 0.8 μm.

An aqueous solution of tris(2,2'-bipyridine)ruthenium acetate (ruthenium content 0.2 wt. %) was prepared. Acetic acid was added to this solution to obtain a metal complex salt-containing solution of a pH of 4.5 to 7.5.

The substrate bearing the resin pattern was immersed in purified water for 30 seconds, and then immersed in the metal complex salt solution so as to obtain a film thickness of 1.0 μm after the immersion. Then the substrate was taken out, rinsed for 5 seconds under running water to wash off the metal complex salt solution present between the resin patterns, then dried for 3 minutes on a hot plate of 80° C., and subjected to a measurement of a film thickness. Thereafter the pattern was baked for 30 minutes at 500° C. in a hot air-circulating oven, thereby obtaining ruthenium oxide electrodes of a distance of 20 μm between the electrodes, a width of 60 μm, a length of 120 μm and a thickness of 50 nm.

The formation of the aforementioned ruthenium oxide electrode was repeated 10 times, and presence/absence of pattern peeling and a time required for immersion were compared. In case the metal complex salt solution had a pH value of 5 to 7, the pattern peeling was not generated and the required time was 3 minutes or less. Results are shown in Table 1.

methods of the foregoing Examples showed satisfactory electron emitting characteristics with a high reproducibility.

Also in case of forming the device electrodes 2, 3 of the electron emitting devices in the electron source shown in FIG. 2, by the methods described in the foregoing Examples, the electron emitting characteristics were uniform among the electron emitting devices.

Also in case of forming the device electrodes 2, 3 of each electron emitting device and the lower wirings 12 and the upper wirings 14 by the methods described in the foregoing Examples, the electron emitting characteristics were more uniform among the electron emitting devices.

Also a highly reliable image display apparatus with a satisfactory display performance could be obtained by applying the electron source produced in the aforementioned method to the image display apparatus shown in FIG. 3.

This application claims priority from Japanese Patent Application No. 2004-253705 filed Sep. 1, 2004, which is hereby incorporated by reference herein.

What is claimed is:

1. A producing method for a pattern of an electroconductive member, comprising:
   a step of forming a resin film on a substrate surface;
   a step of incorporating, into a resin having an acidic group, a liquid containing a first metal complex salt, and a second metal complex salt of which a conjugate acid is a weaker acid than a conjugate acid of the first metal complex salt and of which a metal complex component is same as that of the first metal complex salt; and
   a step of baking the resin film impregnated with the metal component to form a conductive film on the substrate.

TABLE 1

|  | Comp. Ex. | Comp. Ex. | Example | Example | Example | Comp. Ex. | Comp. Ex. |
|---|---|---|---|---|---|---|---|
| pH | 7.5 | 7.1 | 7.0 | 6.0 | 5.0 | 4.9 | 4.5 |
| pattern peeling | peeled | peeled | none | none | none | none | none |
| required time (min) | 1.7 | 1.8 | 1.9 | 2.2 | 2.6 | 3.1 | 5.6 |

Example 4

Resin patterns were prepared in the same manner as in Examples 1-3, and a aqueous solution of tris(2,2'-bipyridine)ruthenium acetate (ruthenium 0.2 wt. %) was prepared. Acetic acid was added to this solution to obtain a first metal complex salt solution of a pH value of 6.0.

Ruthenium oxide electrodes were formed in the same manner as in Examples 1-3, except that the aqueous solution of tris(2,2'-bipyridine)ruthenium carbonate (ruthenium 0.2 wt. %) (second metal complex salt solution) was suitably added in such a manner that the first metal complex salt solution maintained a pH value of 5.9-6.0 and the electrode was formed 100 times. A resistance measurement of the electrode provided a fluctuation in resistance of 2.1% in a satisfactory level.

Comparative Example 5

Ruthenium oxide electrodes were prepared in the same manner as in Example 4, except that the addition of the aqueous solution of tris(2,2'-bipyridine)ruthenium carbonate (ruthenium 0.2 wt. %) for maintaining a pH value of 5.9-6.0 was not conducted. The metal complex solution after 100 electrode formations shows a pH value of 4.8, and the electrodes in 100 formations shows a fluctuation in the resistance of 12.1%.

Also an electron emitting device, produced by forming the device electrodes 2, 3 shown in FIGS. 1A and 1B in the 2. A method for producing a pattern of an electroconductive member according to claim 1, wherein the liquid has a pH value of 5 to 1.

3. A method for producing an electronic device provided with a substrate including a circuit having an electroconductive member in at least a part thereof, wherein at least a part of the electroconductive member is formed by a method for producing a pattern of an electroconductive member according to claim 1.

4. A method for producing an electron emitting device including an electroconductive member as a constituent, wherein the electroconductive member is formed by a method for producing a pattern of an electroconductive member according to claim 1.

5. A method for producing an image display apparatus provided with an electron source including, on a substrate, plural electron emitting devices and plural row wirings and plural column wirings for constituting a matrix wiring of the electron emitting devices, and an image forming member including a light emitting member which emits light by an irradiation of the electrons emitted from the electron emitting devices, wherein at least either one of the electrodes constituting the electron emitting devices, the row wirings and the column wirings is formed by a method for producing a pattern of a conductive member according to claim 1.

6. A method for producing a pattern of an electroconductive member, comprising:
- a step of forming on a substrate surface a resin film containing acid group;
- a step of incorporating into the resin film a liquid having a pH value of 5 to 1 and containing a metal complex salt and a metal complex carbonate of which a conjugate carbonic acid is a weaker acid than a conjugate acid of the metal complex salt and of which a metal complex component is same as a metal complex component of the metal complex salt; and
- a step of baking the resin film to form the electroconductive member from a metal component incorporated into the resin film.

7. A method for producing an electronic device provided with a substrate including a circuit having an electroconductive member in at least a part thereof, wherein at least a part of the electroconductive member is formed by a method for producing a pattern of an electroconductive member according to claim 6.

8. A method for producing an electron emitting device including an electroconductive member as a constituent, wherein the electroconductive member is formed by a method for producing a pattern of an electroconductive member according to claim 6.

9. A method for producing an image display apparatus provided with an electron source including, on a substrate, plural electron emitting devices and plural row wirings and plural column wirings for constituting a matrix wiring of the electron emitting devices, and an image forming member including a light emitting member which emits light by an irradiation of the electrons emitted from the electron emitting devices, wherein at least either one of the electrodes constituting the electron emitting devices, the row wirings and the column wirings is formed by a method for producing a pattern of a conductive member according to claim 6.

10. A method for producing for a pattern of an electroconductive member including a step of forming a resin film on a substrate surface, a step of incorporating into a resin film of a resin having an acidic group, a liquid containing a first metal complex salt, and a step of baking the resin film impregnated with the metal component thereby forming an electroconductive film on the substrate, wherein, in the step of incorporating into the resin film the metal component of the first metal complex salt, a liquid containing a second metal complex salt of which a conjugate acid is a weaker acid than a conjugate acid of the first metal complex salt and of which a metal complex component is same as that of the first metal complex salt is added to the liquid containing the first metal complex.

11. A method for producing a pattern of an electroconductive member according to claim 10, wherein the second metal complex salt is a carbonate salt.

12. A method for producing an electronic device provided with a substrate including a circuit having an electroconductive member in at least a part thereof, wherein at least a part of the electroconductive member is formed by a method for producing a pattern of an electroconductive member according to claim 10.

13. A method for producing an electron emitting device including an electroconductive member as a constituent, wherein the electroconductive member is formed by a method for producing a pattern of an electroconductive member according to claim 10.

14. A method for producing an image display apparatus provided with an electron source including, on a substrate, plural electron emitting devices and plural row wirings and plural column wirings for constituting a matrix wiring of the electron emitting devices, and an image forming member including a light emitting member which emits light by an irradiation of the electrons emitted from the electron emitting devices, wherein at least either one of the electrodes constituting the electron emitting devices, the row wirings and the column wirings is formed by a method for producing a pattern of a conductive member according to claim 10.

* * * * *